United States Patent [19]

Boku

[11] Patent Number: 5,521,116

[45] Date of Patent: May 28, 1996

[54] SIDEWALL FORMATION PROCESS FOR A TOP LEAD FUSE

[75] Inventor: Katsushi Boku, Tsuchiura, Japan

[73] Assignee: Texas Instruments Incorporated, Dallas, Tex.

[21] Appl. No.: 427,479

[22] Filed: Apr. 24, 1995

[51] Int. Cl.⁶ .............................. H01L 21/70; H01L 27/00
[52] U.S. Cl. .................... 437/60; 437/922; 437/228; 148/DIG. 55
[58] Field of Search ..................... 437/922, 195, 437/90–91, DIG. 93, 60, 228 SE, 228 PE, 228 S; 148/DIG. 55; 257/529

[56] References Cited

U.S. PATENT DOCUMENTS

| | | | |
|---|---|---|---|
| 3,564,354 | 2/1971 | Aoki et al. | 317/235 |
| 3,792,319 | 2/1974 | Tsang | 317/235 |
| 4,413,272 | 11/1983 | Mochizuki et al. | 357/65 |
| 4,455,194 | 6/1984 | Yabu | 156/653 |
| 4,774,561 | 9/1988 | Takagi | 257/529 |
| 4,853,758 | 8/1989 | Fischer | 257/529 |

*Primary Examiner*—George Fourson
*Assistant Examiner*—H. Jey Tsai
*Attorney, Agent, or Firm*—Richard B. Havill; Leo N. Heiting; Richard L. Donaldson

[57] ABSTRACT

A method for fabricating and for blowing top lead fuses (41 and 42) includes the steps of: (a) forming a conductive top lead fuse (41) on a layer of insulator (45); (b) depositing a layer of top insulator (47) over the top lead fuse at a top to sidewall thickness ratio of approximately 2:1; (c) anisotropically etching the top insulator back universally to a top to sidewall thickness ratio of approximately 1:2. The resulting top lead fuses (30 and 31) are selectively blown explosively out (24) of the top surface of the top insulator.

2 Claims, 4 Drawing Sheets

SIDEWALL FORMATION PROCESS FOR A TOP LEAD FUSE

FIELD OF THE INVENTION

This invention relates to the structure of a semiconductor integrated circuit device and to the method of making such a device, and more particularly to the structure and method of making of a fuse in an integrated circuit device.

BACKGROUND OF THE INVENTION

Fuses are employed in integrated circuit devices for the purpose of removing defective circuits from active operation and for replacing those defective circuits with good operable redundant circuits. Typically the fuses are fabricated in a conductive layer buried within a structure of surrounding insulator material. The fuses are fabricated in either polysilicon or metal. Typically the insulator is silicon dioxide. The top surface of the fuses is near the top surface of the insulator but is covered by some of the insulator material. Other conductive layers are formed over the top of the insulator material covering the fuses.

A selected fuse is blown, or trimmed, by directing a laser beam at the fuse. Laser energy is absorbed by the fuse material and becomes thermal energy. The fuse material is changed from its original solid state to a liquid state in response to the thermal energy absorbed from the laser beam. As the temperature of the fuse material increases above its boiling point, internal pressure builds up inside of the device structure at the region of the fuse where the laser beam is directed. Pressure exerted by the insulator on the fuse, temporarily maintains the fuse material in its liquid state. As the temperature of the liquid rises, the internal pressure rises higher and higher until stress in the surrounding insulator exceeds the fracture limit of the insulator. The insulator breaks at the weakest point which is toward the top surface of the insulator.

Instantly when the insulator breaks, the pressure on the liquid fuse material drops to ambient pressure and the volume of the liquid fuse expands explosively. Because the temperature of the fuse material is above its boiling point and is at atmospheric pressure, the liquid fuse material vaporizes instantly. The fuse material is blown up out of the insulator leaving a section, which had been occupied by conductive fuse material, completely void of conductive material. Thus an open circuit remains.

When a fuse is blown, the shape of the dielectric is important so that the direction of the explosion is upward from the top surface of the device. If the explosion occurs through the top dielectric covering the fuse, vaporization of the fuse material occurs smoothly because of the large open space above. On the other hand, an explosion to the side causes problems.

As shown in FIG. 1a, in some integrated circuits fuses 10 and 11 are fabricated in the top lead layer of conductors of the integrated circuit device 12. Such top lead layer fuses 10 and 11 are covered by a layer of cap oxide 15 which covers both the top surface and the sidewalls of the fuse material 10, as shown in FIG. 1b.

Typically the dielectric is a cap oxide deposition that proceeds until the dielectric is 3150 Å+/−150 Å thick. The deposition is made at a temperature of 250° C.+/−10° C. and at a pressure of 2.5 TORR+/−0.2 TORR. Gas flow is SiH$_4$: 40 SCCM+/−5 SCCM and N$_2$O: 1300 SCCM+/−100 SCCM. Typically the cap oxide is deposited thicker on the top surface of the fuses than on their sidewalls, as is readily apparent in FIG. 1b. Although the cap oxide insulates the fuses very well, it becomes a source of a problem when the fuses are to be selectively blown, or trimmed.

When a laser beam 18 is directed at the fuse 10, as shown in FIG. 1c, that fuse liquifies, and the cap oxide fractures at the weakest place 20. The weakest place is the thin sidewall rather that the thicker cap oxide 22 over the top of the fuse 10. As shown pictorially in FIG. 1d, the vaporized fuse material 24 is released out the sidewall of the structure and toward the next fuse 11. Slag material 26 from the blown fuse spreads around onto the cap oxide surface between the fuses 10 and 11 and onto the next fuse structure. Depending upon the pattern of slag and the selection of fuses to be blown, undesirable conductive paths can be created through the scattered slag.

Rather than repairing a defective device, the device 12 continues to be defective but with a different defect.

SUMMARY OF THE INVENTION

The foregoing problems are solved by a new method for fabricating top lead fuses and for blowing such fuses. The method includes the steps of (a) forming a conductive top lead fuse on a layer of insulator material; (b) depositing a top insulator over the top lead at a top to sidewall thickness ratio of at least 1:1; (c) anisotropically etching the top insulator back universally to a top to sidewall thickness ratio of approximately 1:2 or less.

The top lead fuses are selectively blown by directing a laser beam at the selected fuse region to be blown. When the selected top lead fuses blow, the fuse material explodes out of the top surface of the top insulator.

BRIEF DESCRIPTION OF THE DRAWINGS

A better understanding of the new top lead fuse structure and the new method for fabricating the top lead fuses may be better understood by reading the following detailed description with reference to the drawings wherein.

DETAILED DESCRIPTION

Figure 1A:
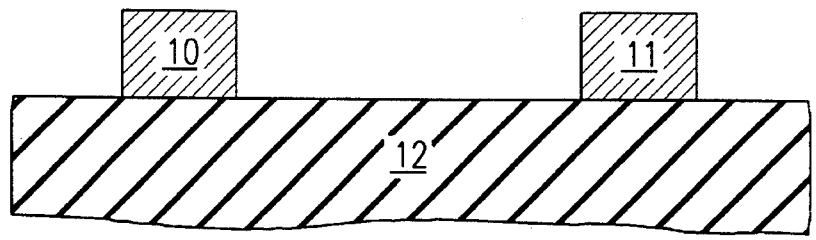
FIGS. 1a–1d represent a prior art sequence of cross-section views of progressive steps in the fabrication and trimming of fuses in an integrated circuit device.
Figure 1B:
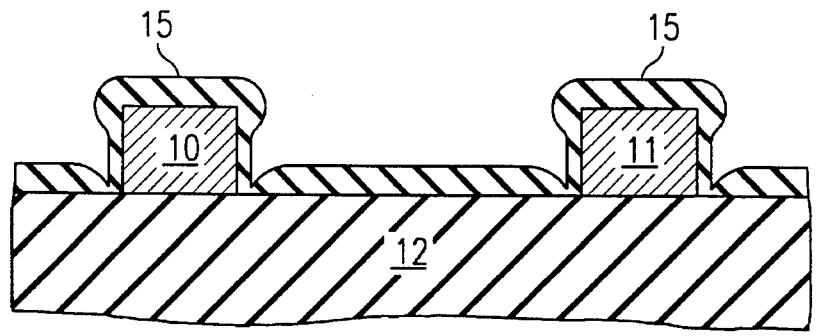
Figure 1C:
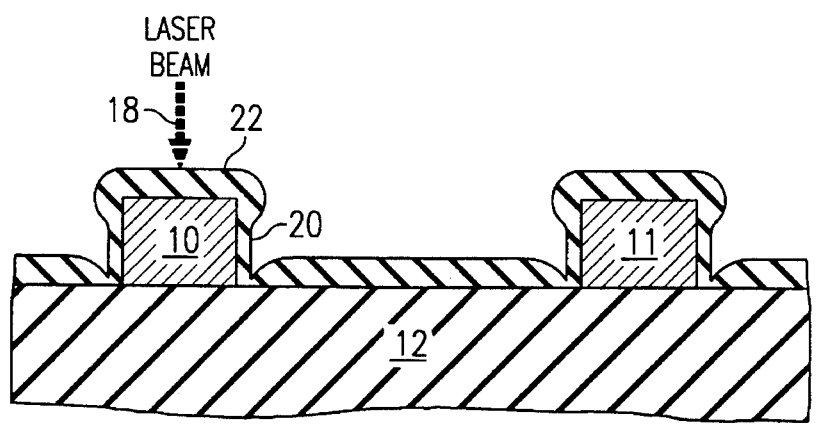
Figure 1D:
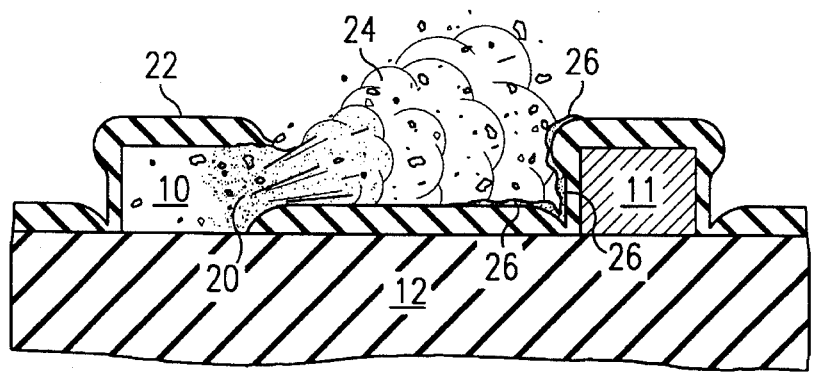
Figure 2A:
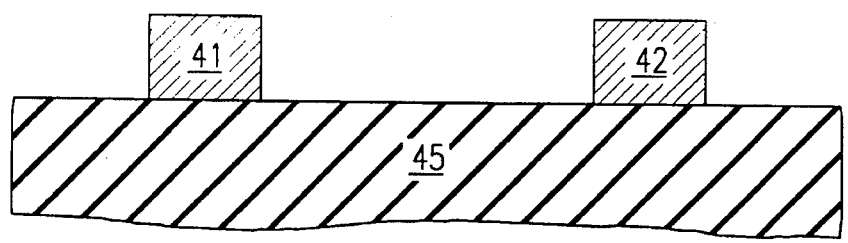
FIGS. 2a–2e represent a sequence of cross-section views of progressive steps in the fabrication and trimming of fuses in an integrated circuit device when it is fabricated in accordance with the invention.

Referring now to FIG. 2a, there is shown a cross-section of a portion of an integrated circuit device including fuses 41 and 42 fabricated on top of an insulator 45. The fuses may be fabricated in a metal, such as aluminum, tungsten, titanium or tantalum or in a semiconductive material such as polysilicon. A layer of the conductive material is laid on the insulator and patterned into the separate fuse devices 41 and 42.

Figure 2B:
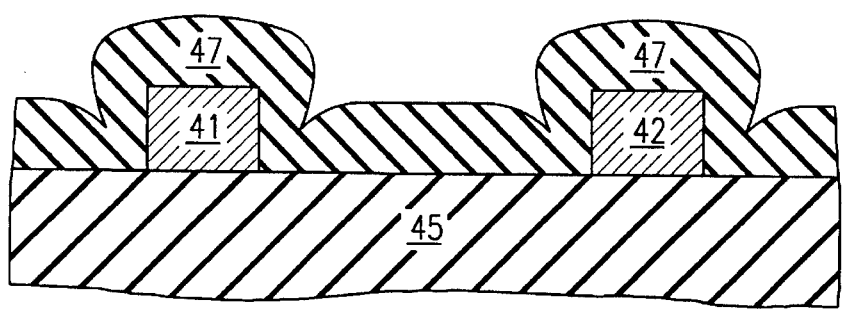

Subsequently, as shown in FIG. 2b, a cap oxide 47, i.e., insulation, is deposited over the fuse structures and the insulator 45. Typically the cap oxide 47 may be silicon dioxide deposited to a thickness of approximately 10,000 Å+/−500 Å. This deposition may be accomplished at a temperature of 250° C.+/–10° C. and a pressure of 2.5 TORR+/–0.2 TORR. Gas flow may be SiH$_4$: 40 SCCM+/–5 SCCM and N$_2$O: 1300 SCCM+/–100 SCCM. It is noted that the ratio of top oxide thickness to sidewall thickness, as shown in FIG. 2b, is in a range of 1:1 to 2:1. After the cap oxide deposition is complete, it is etched back.

Figure 2C:
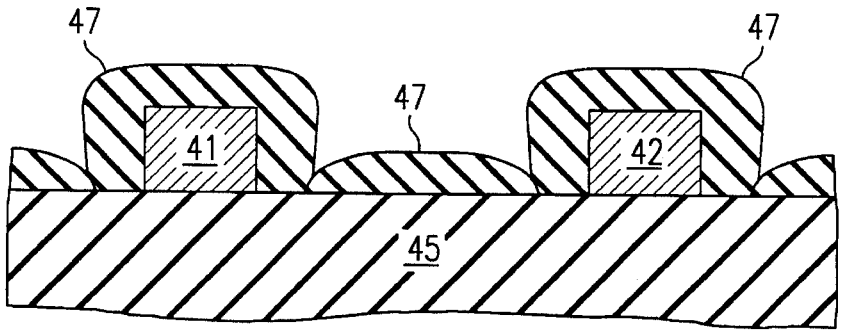

FIG. 2c shows the result of a universal (no masking) anisotropic etch back of the cap oxide 47. The etch back process is carried on until the loss of cap oxide is in a range of 6000 Å+/–500 Å. This process occurs at a temperature of approximately 20° C. and a pressure of approximately 250 mTORR. Gas flow includes CHF$_3$: 30 SCCM, CF$_4$: 3 SCCM, and Ar: 60 SCCM. As shown in FIG. 2c more cap oxide is etched from the tops of the fuses 41 and 42 than from their sidewalls. The thinner cap oxide, or insulator, over the tops of the fuses and the thicker insulator along the sidewalls of the fuses is very advantageous for a subsequent step of blowing selected fuses. A resulting ratio of top oxide thickness to sidewall oxide thickness is in a range of approximately 1:2 to 4:5.

Figure 2D:
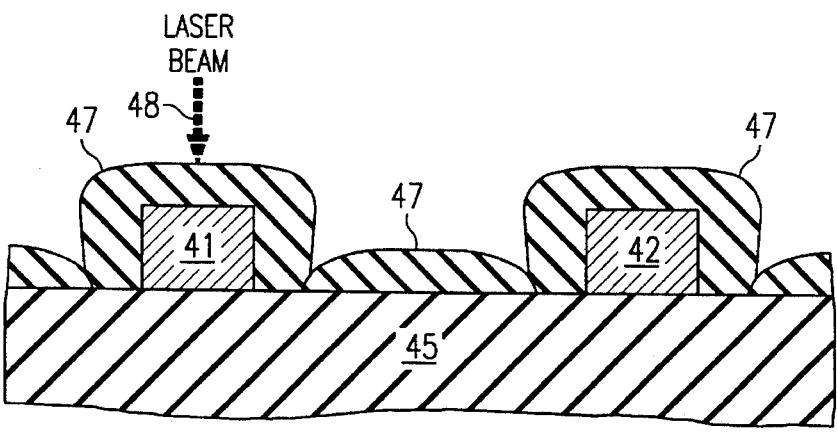
Figure 2E:
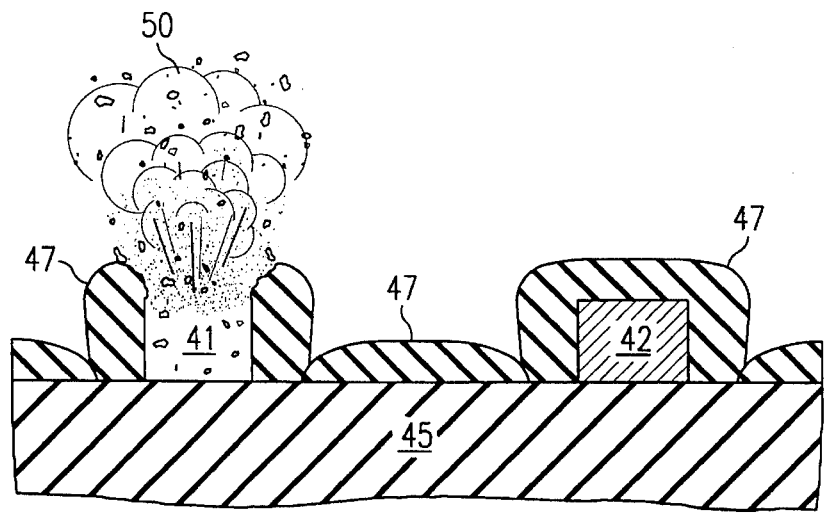

Referring now to FIG. 2d, there is shown a following step in the sequence of fabricating and trimming the fuses 41 and 42. In FIG. 2d, a laser beam 48 is directed at the fuse 41 to heat the fuse and blow it out. As previously explained, the laser energy is converted to thermal energy within the fuse 41. The fuse material changes from its solid state to a liquid state under pressure exerted by the cap oxide 47. The temperature of the fuse 41 increases above the boiling point while the internal pressure increases higher and higher. Finally the internal pressure ruptures the top dielectric, or insulator, covering the fuse 41 and an explosion occurs. The rupture instantly reduces pressure to 1 ATM and the liquified fuse material vaporizes explosively, as shown pictorially in FIG. 2e.

Because the top insulator is thinner than the sidewall insulator the rupture occurs upward from the top of the fuse 41 into an essentially infinite open space, or region. Slag is not scattered between the site of fuse 41 and any other adjacent fuse, e.g., fuse 42, so that no deleterious path is created between blown fuses.

Figure 3A:
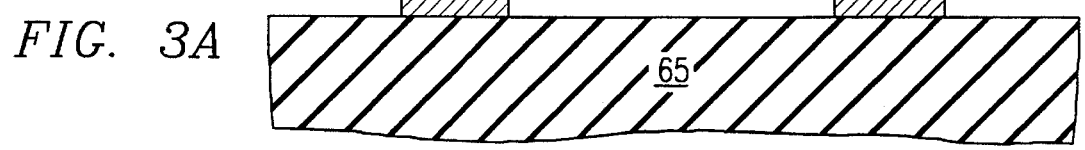
FIGS. 3a–3g represent a sequence of cross-section views of progressive steps in the fabrication and trimming of fuses in an integrated circuit device when it is fabricated in accordance with the invention.

Referring now to FIG. 3a there is shown a cross-section of a part of another integrated circuit semiconductor device. Fuses 61 and 62 are formed on the surface of an insulator, or dielectric, 65. The fuses may be fabricated in a metal, e.g., aluminum, tantalum, tungsten, or in a semiconductor, e.g., polysilicon. Thereafter two dielectric depositions are made.

Figure 3B:
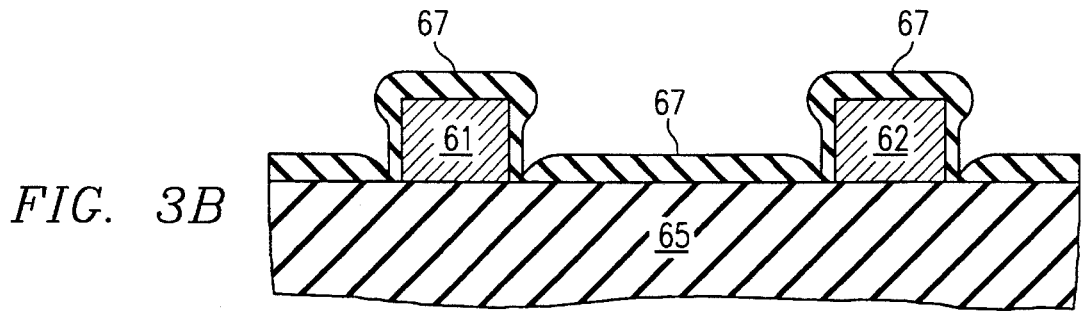

In FIG. 3b, there is shown the cross-section of the semiconductor device after a first oxide deposition 67, or dielectric, is deposited by plasma TEOS. The oxide deposition proceeds until the oxide has a thickness of 3500 Å+/–350 Å over the top of the fuses. This deposition process step is performed at a temperature of approximately 390° C. and a pressure of approximately 9.0 TORR. Gas flow includes TEOS: 1000 SCCM and O$_2$: 500 SCCM.

Figure 3C:
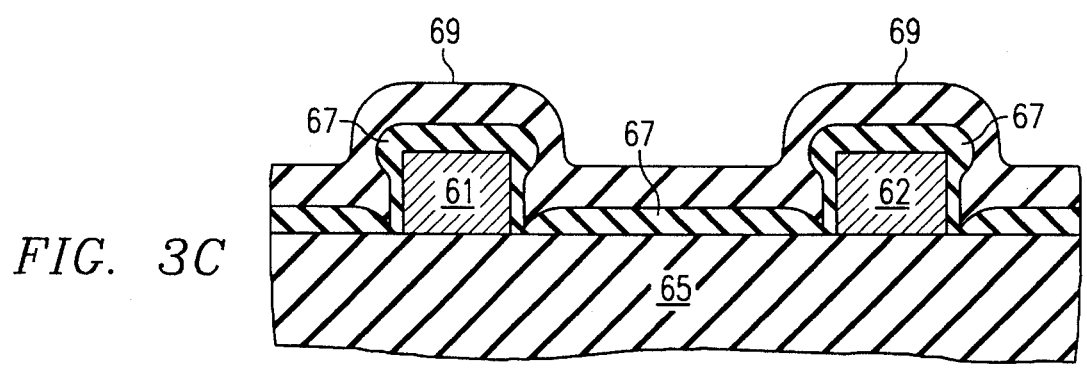

In FIG. 3c, a cross-section shows a second oxide deposition 69, or dielectric, deposited by AP ozone TEOS. This second oxide deposition 69 proceeds until the oxide has a thickness of 3500 Å+/–350 Å over the top of the fuses. A temperature in a range of 420° C. +/–120° C. and a pressure of 1 ATM (1.0–2.0 mmH$_2$0 exhaust) are maintained. Gas flow is N$_2$: 18.0 slm; Si: 3.0 slm; and O$_3$/O$_2$: 7.5 slm.

Figure 3D:
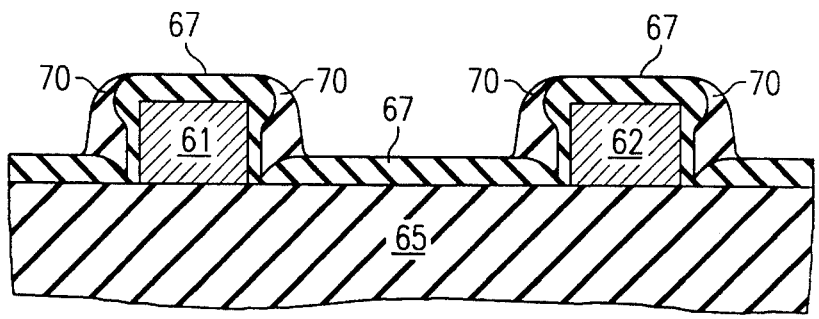

FIG. 3d shows the cross-section of the part of the device following a universal anisotropic etch back of the oxide deposition. Etch loss proceeds until 3500 Å+/–200 Å of the dielectric, mostly dielectric 69, are removed from the top of the fuses 61 and 62. This etching is accomplished at a temperature of approximately 20° C. and at a pressure of 250 mTORR. Gas flow is CHF$_3$: 30 SCCM; CF$_4$: 3 SCCM; and Ar: 60 SCCM. It is noted that more of the oxide deposition is etched off of the tops of the fuses than along the sidewalls. Thus the remaining sidewall oxide 70 is thicker than the oxide covering the tops of the fuses.

Figure 3E:
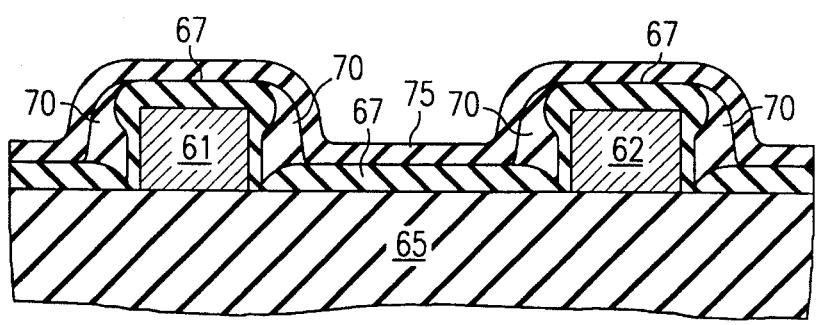

Referring now to FIG. 3e, there is shown the cross-section of the device after a deposition of a third layer oxide 75 overall by plasma SiH$_4$. This third layer of dielectric is deposited until the layer is 2000 Å+/–350 Å thick. The deposition occurs at a temperature of approximately 380° C. and a pressure of approximately 3.0 TOFF. Gas flow is SiH$_4$: 50 SCCM and N$_2$O: 1300 SCCM. It is noted that the resulting thickness of the sidewall dielectric to the top dielectric is approximately in a range of 5:4 to 2:1 after the third dielectric deposition is completed. The device is prepared for fuse trimming.

Figure 3F:
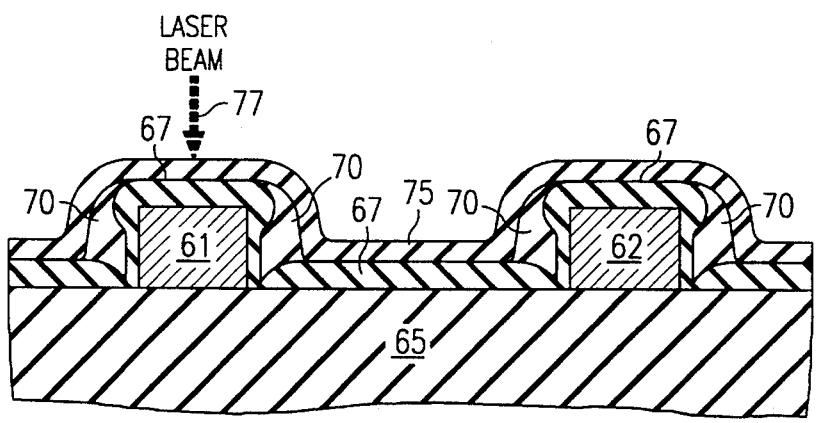

As shown in FIG. 3f, a laser beam 77 is directed at the fuse 61 which is selected to be trimmed, or blown. The laser beam energy is converted to thermal energy in the fuse 61 which heats up and liquifies. The temperature of the fuse material rises higher and higher creating more and more pressure within the confines of the dielectric surrounding fuse 61. When the pressure rises sufficiently, the dielectric fractures at its weakest point which is on the top of the fuse 61.

Figure 3G:
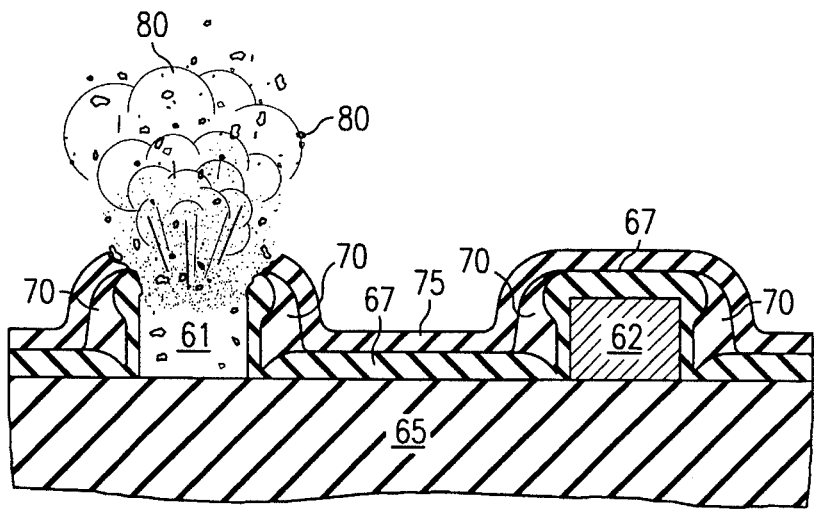

FIG. 3g shows an explosive eruption 80 of the dielectric, that instantly reduces the pressure on the fuse material to atmospheric pressure and causes the liquified fuse material to vaporize. Advantageously the eruption occurs in an upward direction where there is ample space for the fuse material to disperse without leaving deleterious slag reside between blown fuses to cause undesired electrical current paths in the device.

It is noted that the process sequences of FIGS. 2a–2e and 3a–3g are completed without any masking steps.

The foregoing describes two sequences of processing steps for forming advantageous sidewall structures for a top lead fuse. The described sequences together with other processing sequences made obvious in view thereof are considered to be covered by the appended claims.

What is claimed is:

1. A method for fabricating a top lead fuse includes the steps of:
   a) forming a conductive top lead fuse on a layer of insulator material;
   b) depositing a top insulator over the top lead fuse at a top to sidewall thickness ratio of at least 1:1; and
   c) anisotropically etching the top insulator back universally to a top to sidewall thickness ratio of approximately 1:2 to 4:5.

2. The method of claim 1 including the further step of:
   d) blowing the top lead fuse out of the top surface of the top insulator.

* * * * *